United States Patent

Aschwanden

[11] 4,204,173
[45] May 20, 1980

[54] TUNING CIRCUIT WITH PROVISIONS FOR REDUCING PULSE WIDTH JITTER

[75] Inventor: Felix Aschwanden, Thalwil, Switzerland

[73] Assignee: RCA Corporation, New York, N.Y.

[21] Appl. No.: 935,204

[22] Filed: Aug. 21, 1978

[30] Foreign Application Priority Data

Aug. 22, 1977 [GB] United Kingdom ............ 35167/77

[51] Int. Cl.² .................. H03B 3/04; H03K 4/02; H03K 4/08; G01R 17/06
[52] U.S. Cl. ...................... 331/1 A; 331/25; 307/227; 207/228; 307/359; 324/99 D; 328/147; 455/179
[58] Field of Search ............... 331/1 A, 25; 307/227, 307/228, 357, 359; 328/146, 147; 324/99 D, 77 A; 325/464, 468, 419

[56] References Cited

U.S. PATENT DOCUMENTS 4,097,810  6/1978  Aschwanden .................. 325/464 X

OTHER PUBLICATIONS

Jacob Millman and Herbert Taub, "Pulse, Digital and Switching Waveforms", McGraw-Hill, 1965, pp. 674-675.

Hermann Schmid, "An Electronic Design Practical Guide to A/D Conversion, Part 2", Electronic Design, Dec. 19, 1968; pp. 58-61.

*Primary Examiner*—Siegfried H. Grimm
*Assistant Examiner*—Edward P. Westin
*Attorney, Agent, or Firm*—Eugene M. Whitacre; Paul J. Rasmussen; Peter M. Emanuel

[57] ABSTRACT

A timing circuit useful in measurement and control applications includes a comparator for generating an output pulse having a duration dependent on when the magnitude of a ramp-like input signal exceeds the magnitude of a DC input signal. The output pulse is coupled to a low pass filter for generating a correction signal having a magnitude proportional to the time duration of the output pulse. The correction signal is coupled to offset circuitry to shift one of the input signals relative to the other to compensate for jitter or short term variations in the duration of the output signal.

13 Claims, 4 Drawing Figures

TUNING CIRCUIT WITH PROVISIONS FOR REDUCING PULSE WIDTH JITTER

ENVIRONMENT OF THE INVENTION

The present invention is directed to the field of timing circuits for generating output pulses having durations representing analog information.

A variety of measurement and control systems are known which employ circuits for generating an output pulse having durations representing analog information. For example, in a digital voltmeter a timing circuit including a voltage comparator may be employed to generate an output pulse having its duration dependent on when the magnitude of a ramp-like reference voltage exceeds the magnitude of an unknown DC voltage to be measured. The output pulse is coupled to a counter. The duration of the output pulse determines the count accumulated by the counter. The counter is coupled to a digital display which displays a decimal number corresponding to the accumulated count. Additionally, a timing circuit may be employed in a phase locked loop tuning system for generating a local oscillator signal for a receiver of the type disclosed in U.S. Pat. No. 4,097,810, issued in the name of the present inventor. In this tuning system, a timing circuit generates output pulses having a duration controlled by the adjustment of a potentiometer. The output pulses are coupled to a programmable divider which divides the frequency of the local oscillator by a programmable factor related to its frequency. The programmable factor is determined by the duration of the output pulse.

Such systems are susceptible to error in the form of jitter or short term variation of the duration of the output pulse due to such causes as noise. In a digital voltmeter the jitter may manifest itself by causing the digital display to flicker even though the unknown voltage is relatively stable. In a tuning system of the type described above, jitter may cause the frequency of the local oscillator signal to jump between adjacent stations.

SUMMARY OF THE PRESENT INVENTION

A timing circuit comprising comparator means for generating an output pulse having a duration dependent on when the magnitude of one of a first input signal having a ramp-like waveform and a second input signal exceeds the magnitude of the other includes correction means for generating a correction signal having a magnitude proportional to the duration of the output signal. The correction signal is coupled to offset means which shifts on one of the input signals relative to the other to inhibit jitter or relatively short term variations of the duration in the output signal.

Figure 1:
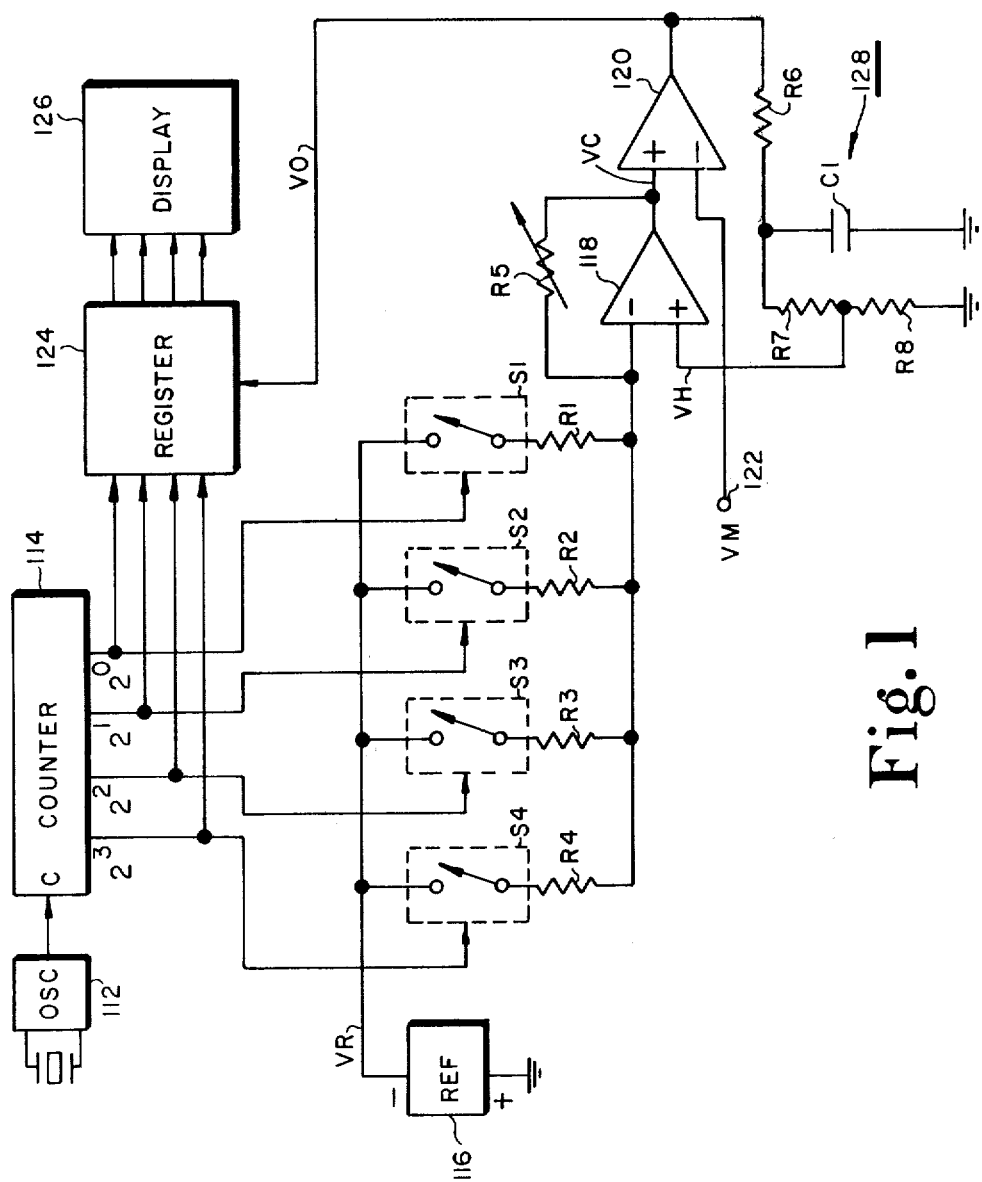
FIG. 1 shows partially in block diagram form and partially in schematic form a digital voltmeter comprising an analog-to-digital converter utilizing the present timing circuit.
Figure 2A:
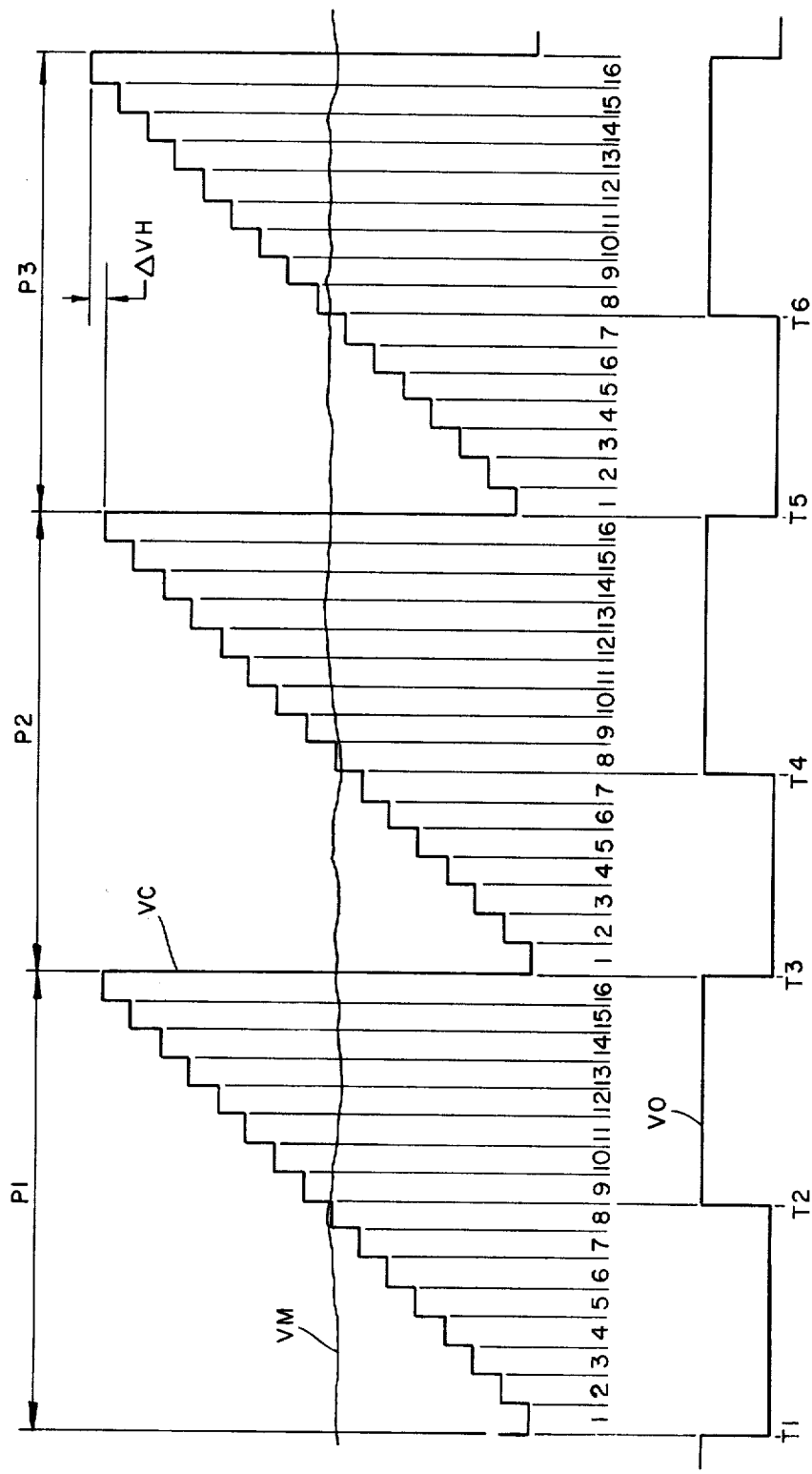
FIGS. 2A and 2B graphically represent waveforms useful in understanding the present timing circuit as employed in the analog-to-digital converter shown in FIG. 1.
Figure 2B:
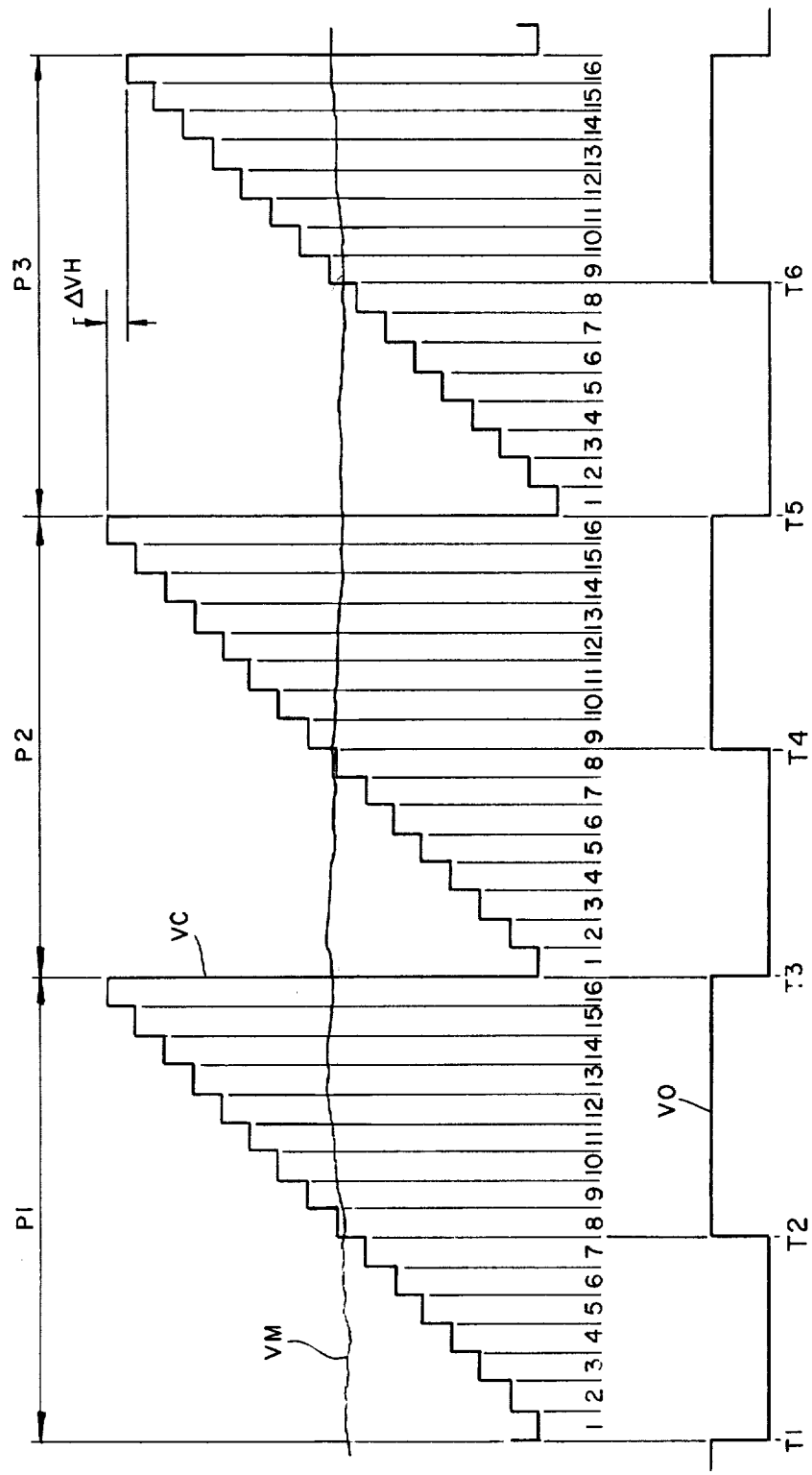

Concurrent reference should be made to FIGS. 1, 2A and 2B.

DETAILED DESCRIPTION OF THE DRAWING

The digital voltmeter shown in FIG. 1 comprises a digital-to-analog (A/D) converter in which clock pulses generated by a crystal controlled oscillator 112 are coupled to the clock (C) input of a four stage binary counter 114. Each of the four stages of counter 114 generates a respective binary signal representing, when it is at a relatively high voltage level, a power of 2. Collectively the binary signals represent the count accumulated by counter 114. In response to successive clock pulses, counter 114 counts in increments of 1 between 0 and 15. The binary signals generated by counter 114 are coupled to control inputs of respective switches S1, S2, S3 and S4. Switches S1, S2, S3 and S4 close when the respective binary signal is at its high voltage level. Upon the closure of a switch S1, S2, S3 or S4, a negative reference voltage VR, generated by a voltage reference source 116, is coupled through a respective resistor R1, R2, R3 or R4 to an inverting (−) input of an operational amplifier 118. Resistors R1, R2, R3 and R4 have resistance values in the proportionate relationship of 1:2:4:8 respectively. A variable resistor R5, coupled between the inverting (−) input of amplifier 118 and its output, is utilized to scale the voltage, hereinafter referred to as comparison voltage VC, developed at the output of amplifier 118. Comparison voltage VC is a generally ramp-like voltage having a magnitude dependent on the closure of switches S1, S2, S3 and S4. Specifically, as the count of counter 114 increases, voltage VD increases in stepwise fashion as indicated by staircase-like waveforms shown in FIGS. 2A and 2B.

The output of amplifier 118 is coupled to the noninverting (+) input of a voltage comparator 120. An unknown DC voltage VM to be measured is applied to the inverting (−) input of comparator 120 through an input terminal 122. The output voltage VO of comparator 120 is coupled to latch input of a register 124. When the magnitude of the comparison voltage VC exceeds the magnitude of the voltage to be measured VM, the output voltage VO changes from a relatively low voltage level to a relatively high voltage level. The change in the voltage VO causes register 124 to store the binary signals generated by counter 114 representing the count accumulated at that point in time. The binary signals stored by register 124 are coupled to a display unit 126 which displays the decimal number they represent. Since register 124 stores the binary signals representing the count at which voltage VC exceeds voltage VM, the displayed number is proportional to the voltage VM.

Errors due to noise or other relatively short term perturbations may cause corresponding short term variations, sometimes referred to as jitter, of the duration of the relatively low voltage level of voltage VO. As a result, the count stored in register 124 may change, for example, in the least significant digit portion (i.e., the $2^0$ position) and the display will flicker. Specifically, if voltage VM changes relative to voltage VC between consecutive counting periods due to the presence of noise superimposed on voltage VM or noise internally generated by components of the analog-to-digital converter, the count at which voltage VO changes levels may undergo a corresponding change. For example, with reference to FIG. 2A, during counting period P1 the magnitude of voltage VC exceeds the magnitude of voltage VM at the beginning of the 9th clock pulse and consequently the duration of the low level portion of voltage VO between T1 and T2 is 8 clock pulses long. If the magnitude of voltage VM falls during the succeeding counter period P2 so that the magnitude of voltage VC exceeds the magnitude of voltage VM at the beginning of the 8th clock pulse rather than the 9th clock pulse, the duration of the low level portion of voltage VO between T3 and T4 is 7 clock pulses long, i.e., 1 clock pulse shorter than the corresponding time interval between T1 and T2. However, if the change in voltage VM is small, the magnitude of voltage VM may be very near the magnitude of the voltage VC during the 8th clock pulse and a small amount of noise could cause the magnitude of VM to temporarily exceed the magnitude of VC during the 8th clock pule of counting period P3 and thereby cause jitter in the duration of the low level portion of voltage VO.

To inhibit short term variations of the duration of the low level portion of voltage VO due to a noise superimposed on voltage VM, one approach would be to filter the voltage VM. However, such an approach would not account for noise generated by components of the analog-to-digital converter itself. To inhibit jitter of the duration of the low level portion of voltage VO due to both sources of noise, in the analog-to-digital converter shown in FIG. 1, a low pass filter network 128 is coupled between the output of comparator 120 and the noninverting (+) input of amplifier 118 to generate a hysteresis correction voltage VH which shifts comparison voltage VC relative to measured voltage VM to compensate for short term perturbations of one of these voltages relative to the other. The term "hysteresis" is utilized since the instantaneous value of the magnitude of correction voltage VH depends on whether the duration of the low level portion of voltage VO has increased or decreased during the last counting period. Specifically, the instantaneous value of the magnitude of correction voltage VH is inversely proportional to the duration of the low level portion of voltage VO (or directly proportional to the duration of the high level portion of voltage VO). Thus, as indicated in FIG. 2A, if the duration of the low level portion of voltage VO between T3 and T4 in counting period P2 decreases by 1 clock pulse with respect to the duration of the low level portion of voltage VO between T1 and T2 in counting period P1 because the magnitude of voltage VM has decreased slightly, hysteresis voltage VH increases by a corresponding amount ΔVH in counting period P3. Accordingly, comparison voltage VC is shifted upward by an amount ΔVH in counting period P3 so that it is more difficult for noise to cause the magnitude of voltage VM to exceed the magnitude of voltage VC during the 8th clock pulse. As a result, in counting period P3, the magnitude of voltage VC continues to exceed the magnitude of voltage VM during the 8th clock pulse and the duration of the low level portion of voltage VO, between T5 and T6 in counting period P3, is again 7 clock pulses long, as it was during counting period P2.

FIG. 2B depicts the opposite situation to that depicted in FIG. 2A. That is, while in counting period P1 the duration of the low level portion of voltage VO between T1 and T2 is 7 clock pulses long, in counting interval P2, because the magnitude of voltage VM has increased slightly, the duration of the low level portion of voltage VO between T3 and T4 is 8 clock pulses long. In response to the 1 clock pulse increase in the duration of the low level portion of voltage VO, hysteresis voltage VH decreases by a corresponding amount ΔVH and comparison voltage VC is shifted downward by ΔVH so that it is more difficult for noise to cause the magnitude of voltage VM to fall below the magnitude of voltage VC during the 8th clock pulse. As a result, the magnitude of voltage VC continues to exceed the magnitude of voltage VM during the 9th clock pulse and the duration of the low level portion of voltage VO, between T5 and T6 in counting period P3, is again 8 clock pulses long as it was in counting period P2.

While the steady state magnitude of correction voltage VH at a particular magnitude of measured voltage VM is directly proportional to the number of clock pulses which have occurred when the magnitude of VC exceeds the magnitude of VM, the change in correction voltage ΔVH is determined by the magnitude and the sense of the jitter of the duration of the low level portion of voltage VO and is independent of the steady state magnitude of VH. Thus, at a particular magnitude of VM, as long as the duration of the low level portion of voltage VO remains substantially jitter free, there is no change in VH.

The implementation of low pass filter network 128 shown in FIG. 1 includes a low pass filter comprising resistor R6 and capacitor C1 and a voltage divider comprising resistors R7 and R8. The values of resistors R7 and R8 determine the magnitude of hysteresis correction voltage VH.

A hysteresis circuit of the type described with reference to the A/D converter shown in FIG. 1 may also be employed in other applications where it is desired to reduce jitter associated with the duration of a pulse signal. For example, it is useful in the type of tuning system described in U.S. Pat. No. 4,097,810 referred to above, hereby incorporated by reference, in which the duration of a pulse signal is adjusted to control the frequency of the local oscillator signal generated by the tuning system. The specific manner in which it may be utilized is described with reference to the radio receiver shown in FIG. 3.

Figure 3:
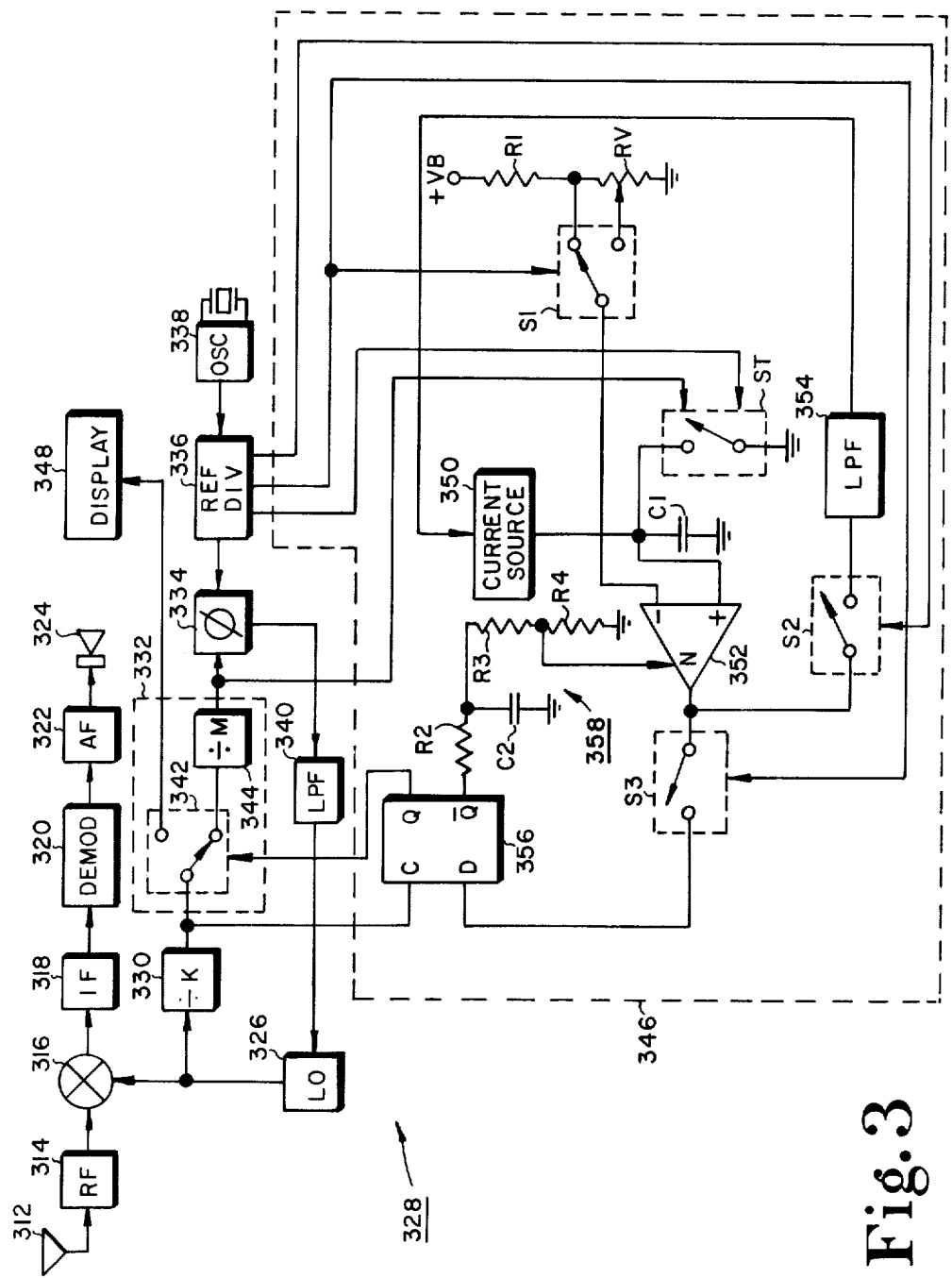
FIG. 3 shows partially in block diagram form and partially in schematic form a tuning system utilizing the present timing circuit.

In the receiver shown in FIG. 3, RF carriers bearing audio information, received by an antenna 312, are amplified and filtered by an RF signal processing unit 314. A mixer 316 combines the processed RF carriers with a local oscillator signal having a frequency determined in accordance with the selected station to produce an IF signal. The IF signal is amplified and filtered by an IF signal processing unit 318. A demodulator derives an audio frequency (AF) signal from the processed IF signal. The AF signal is filtered and amplified by an audio frequency processing unit 322 and thereafter coupled to a speaker 324.

The local oscillator signal is generated by a voltage controlled local oscillator 326 in response to a control voltage generated by a phase locked loop (PLL) tuning system 328. PLL tuning system 328 includes a prescaler 330 for dividing the frequency of the local oscillator signal by a predetermined factor K selected so that its output signal has a frequency which is compatible with the frequency limitations of a programmable divider 332 to which it is coupled. Programmable divider 332 divides the frequency of the output signal of prescaler 330 by a number N determined by the selected station. The output signal of programmable divider 332 is coupled to one input of a phase (φ) comparator 334. A reference frequency signal generated by a reference divider 336 in response to the output signal of a crystal controlled oscillator 338 is coupled to the other input of phase comparator 334. Phase comparator 334 generates an error signal representing the phase and frequency deviation between its two input signals. The error signal is filtered by a low pass filter 340 to derive the control voltage for local oscillator 326. The control voltage changes until the output signal of programmable divider 332 and the reference frequency signal have substantially the same frequency. At this point, the frequency ($f_{LO}$) of the local oscillator signal is related to the frequency ($f_{REF}$) of the reference frequency signal by the following relationship:

$$f_{LO} = KN f_{REF} \qquad (1)$$

Programmable divider 332 includes an input switch 342 for selectively coupling the output signal of prescaler 330 to a divider 344. Divider 344 divides the frequency of the signal coupled to it by a fixed factor M so that divider 344 generates an output pulse after M output pulses of prescaler 330. A time interval control circuit 346 generates a negative-going output pulse in response to each output pulse of divider 344. During the negative-going output pulse of time interval control unit 346, X output pulses of prescaler 330 are decoupled from the input of divider 344 by input switch 342. As a result, divider 344 generates one output pulse for every $N = X + M$ output pulses of prescaler 330 where X depends on the duration of the negative-going output pulse of time interval control circuit 346. In addition, during the negative-going output pulse of control circuit 346, the X output pulses of prescaler 330 decoupled from the input of divider 344 are coupled to a display unit 348 where they are counted to produce a display of the selected station.

Time interval control circuit 346, which is described in copending U.S. patent application Ser. No. 925,655, filed in the name of the same inventor on July 17, 1978, hereby incorporated by reference, includes a switch ST coupled across a capacitor C1. The output pulses of divider 344 are coupled to the control input of switch ST. In response to each output pulse of divider 344, switch ST closes, thereby discharging capacitor C1. After the termination of each output pulse of divider 344, switch ST opens thereby allowing a current generated by a constant current source 350 to charge capacitor C1. As a result, a linearly increasing voltage is developed across capacitor C1. The voltage developed across capacitor C1 is coupled to the noninverting (+) input of a voltage comparator 352, which may, for example, comprise a CA3130 integrated circuit commercially available from RCA Corporation. The inverting (−) input of voltage comparator 352 is coupled to the wiper arm of a potentiometer RV. Potentiometer RV is coupled in series with a resistor R1 between a positive supply voltage VB and ground.

When the magnitude of the voltage developed across capacitor C1 exceeds the magnitude of the voltage developed at the wiper arm of potentiometer RV, the output voltage of comparator 352 switches from a relatively low level to a relatively high level. Thus, the output voltage of comparator 352 has a low level portion having a duration which extends from the trailing edge of the respective output pulse of divider 344 to the time at which the magnitude of the voltage developed across capacitor C1 substantially equals the magnitude of the voltage developed at the wiper arm of potentiometer RV. The duration of the low level portion of the output voltage of comparator 352 is directly related to the resistance value of potentiometer RV between its wiper arm and ground.

The duration of the low level portion of output voltage of comparator 352 may vary due to such causes as temperature and power supply variations. To reduce such variations, a reference trigger pulse generated by reference divider 336 is coupled to the control input of switch ST during a comparison interval between the output pulses generated by divider 344. In response to the reference trigger pulses, switch ST closes. After the termination of the reference trigger pulse, a linearly increasing voltage is developed across capacitor C1 as it is charged from constant current source 350. At the same time, a switch S1 couples the inverting input of voltage comparator 352 to the junction of resistor R1 and potentiometer RV instead of to the wiper arm of potentiometer RV. As a result, the duration of the low level portion of the output voltage of comparator 352 generated in response to the reference trigger pulse during the comparison interval has a maximum duration.

At a predetermined time after the reference trigger pulses, a reference time pulse is generated by reference divider 336. The time interval between the trailing edge of reference trigger pulse and the center of the reference time pulse is selected to equal the nominal value of the maximum duration of the low level portion of the output voltage of comparator 352. The reference time pulse is coupled to the control input of a switch S2. Switch S2 is coupled between the output of voltage comparator 352 and a low pass filter 354 and serves to detect the coincidence between the center of the reference time pulses and the termination of the low level portion of the output voltage of comparator 352 generated in response to the reference trigger pulses. If the low level portion does not terminate at the midpoint of the reference time pulses, a pulse having a polarity representing the sense of the deviation is coupled to low pass filter 354. Low pass filter 354 filters the pulse generated by switch ST to generate a control voltage which is coupled to current source 350 to alter the current developed by current source 350 to reduce errors in the duration of the low level portion of output voltage of comparator 352 due to temperature and power supply variations.

A switch S3 is coupled between the output of comparator 352 and the data (D) input of a D flip-flop (FF) 356. Switch S3 is normally closed. The negative-going output pulse of time interval control circuit 346 is generated at the Q output of D FF 356. The output of prescaler 330 is coupled to the clock (C) input of FF 356. The voltage level at the D input of FF 356 is transferred to its Q output in response to the leading edge of each positive-going output pulse of prescaler 330. Thus, the duration of the negative-going output pulse of time interval control circuit 346 begins with the leading edge of the first positive-going output pulse of prescaler 330 which occurs after the output voltage of comparator 352 changes from its high voltage level to its low voltage level and ends with the leading edge of the first positive-going output pulse of prescaler 330 which occurs after the output voltage of comparator 352 changes from its low level to its high level. During the comparison interval, switch S3 is opened to decouple the output voltage of comparator 352 from the D input of FF 356 so that the level changes in the output voltage of comparator 352 during the comparison interval do not affect the duration of the negative-going output pulse of time interval circuit 346.

If the output voltage of comparator 352 changes level at a time substantially coincidental with the leading edge of the corresponding positive-going output pulse of prescaler 330, FF 356 may not change state properly until the next positive-going output pulse of prescaler 30. Therefore, the output duration of the negative-going output pulse of time interval control circuit 346 may undergo a short term perturbation or jitter equal to the time interval between leading edges of two positive-going output pulses of prescaler 330. This may cause X to vary by 1 with respect to its nominal value, thereby causing a corresponding variation in N and the frequency of the local oscillator signal.

To reduce such jitter of the duration of the negative-going output pulse of time interval control circuit 346, a low pass filter network 358 is coupled between the Q output of FF 356 and a null (N) input of comparator 352. The voltage generated at the $\overline{Q}$ output of FF 356 is the complement of the voltage generated at its Q output. Filter network 358 filters the voltage generated at the $\overline{Q}$ output of FF 356 to derive a hysteresis correction voltage which is coupled to the N input of comparator 352 to determine the voltage difference between its two inputs at which its output voltage changes level. Accordingly, the hysteresis voltage offsets the ramp-like comparison voltage developed at the noninverting (+) input of comparator 352 with respect to the relatively fixed voltage developed at its inverting (−) input to inhibit jitter of the duration of the negative-going output pulse of time interval control circuit 346 developed at the Q output of FF 356 in a manner similar to that provided by filter network 128 of the analog-to-digital converter shown in FIG. 1.

Filter network 358 is similar to filter network 128 fo the A/D converter shown in FIG. 1 and includes a low pass filter comprising a resistor R2 and capacitor C2 and a voltage divider comprising resistors R3 and R4. The values of resistors R3 and R4 determine the magnitude of the hysteresis correction voltage coupled to the N input of comparator 352.

What is claimed is:

1. Apparatus comprising:
    first means for generating a first input signal having a ramp-like waveform;
    second means for providing a second input signal;
    comparison means for generating an output signal in response to said first and second input signals having a first level when the magnitude of said first input signal exceeds the magnitude of said second input signal and a second level when the magnitude of said second input signal exceeds the magnitude of said first input signal;
    correction means for generating a correction signal representing the duration of one of said levels;
    offset means for shifting one of said first and second input signals relative to the other in response to said correction signal to inhibit a change of said duration; and
    utilization means for utilizing said output signal.

2. The apparatus recited in claim 1 wherein:
    said correction means includes low pass filter means responsive to said output signal.

3. The apparatus recited in claim 2 wherein:
    said first means includes clock means for generating clock pulses; counter means responsive to said clock pulses for generating a plurality of binary signals each representing a respective power of the number 2 and representing in combination the number of clock pulses counted by said counter means; a plurality of resistive means each having a resistance value related to a respective power of 2; a source of a reference voltage; summing means having an input for summing signals coupled to said input; and a plurality of switch means each for selectively coupling said reference voltage to said summing means through a respective one of said resistive means in response to a respective one of said binary signals to generate said first input signal; and
    said utilization means includes register means for storing said binary signals generated by said counter means when said output signal changes from one of said first and second levels to the other one of said levels; and display means for displaying the decimal number corresponding to the binary signals stored in said register means.

4. The apparatus recited in claim 3 wherein:
    said summing means includes an operational amplifier having inverting and noninverting inputs, said switch means coupling said reference voltage to one of said inverting and noninverting inputs, said correction means coupling said correction signal to the other one of said inverting and noninverting inputs.

5. The apparatus recited in claim 2 wherein:
    said comparator means includes a voltage comparator having inverting and noninverting inputs, an output and a null input for controlling the voltage difference between said inverting and noninverting inputs at which the voltage developed at said output changes level, said first input signal being coupled to one of said inverting and noninverting inputs, said second input means includes a source of a DC signal, said DC signal being coupled to the other one of said inverting and noninverting inputs, said correction signal being coupled to said null input to control said voltage difference.

6. Apparatus comprising:
    first means for generating a ramp-like signal;
    second means for generating a DC signal;
    comparison means for generating a first output signal in response to said ramp-like signal and said DC signal having a first level when the magnitude of said ramp-like signal exceeds the magnitude of said DC signal and a second level when the magnitude of said DC signal exceeds the magnitude of said ramp-like signal;
    a source of synchronizing pulses;
    synchronizing means for generating a second output signal having a first level beginning at a predetermined edge of the synchronizing pulse which occurs after said first output signal changes from its second level to its first level and a second level beginning at said predetermined edge of the synchronizing pulse which occurs after said first output signal changes from its first level to its second level, the level of said second output signal being ambiguous when the level of said first output signal changes in substantial coincidence with said predetermined edge of said synchronizing pulses;
    correction means for generating a correction signal representing the duration ot one of said levels of said second output signals;

offset means for shifting the magnitude of one of said ramp-like and DC signals relative to the other in response to said correction signal to inhibit a change of said duration; and utilization means for utilizing said second output signal.

7. The apparatus recited in claim 6 wherein:
said correction means includes low pass filter means.

8. The apparatus recited in claim 7 wherein:
said synchronization means includes a data type flip-flop having a clock input, a data input and at least one output, said synchronizing pulse being coupled to said clock input, said first output signal being coupled to said data input, said second output signal being developed at said output.

9. The apparatus recited in claim 7 wherein:
said first means includes capacitive means; current source means for generating a current for charging said capacitive means to develop said ramp-like signal; a source of input trigger pulses; and shunt switch means coupled to said capacitive means for discharging said capacitive means in response to said input trigger pulses; and said second means includes a source of a supply voltage; variable resistance means coupled to said source of said supply voltage for generating said DC signal.

10. The apparatus recited in claim 9 wherein:
said source of synchronizing pulses includes controlled oscillator means for generating an oscillator signal having a frequency controlled in response to a control signal;

said source of input trigger signals includes programmable frequency divider means for dividing the frequency of said oscillator signal by a programmable factor to generate a frequency divided local oscillator signal having one of said input trigger signals occurring during each cycle thereof;

said source of synchronizing pulses also includes a source of a frequency reference signal and phase comparator means for generating said control signal in response to at least one of the phase and frequency relationships between said frequency reference signal and said frequency divided signal; and said utilization means includes programmable factor control means for controlling said programmable factor in accordance with the duration of one of said first and second levels of said second output signal.

11. The apparatus recited in claim 10 wherein:
said programmable frequency divider means includes counter means; and said programmable factor control means includes input switch means coupled between said controlled oscillator means and said counter means for selectively decoupling said oscillator signal from said counter means during the duration of said one of said first and second levels of said second output signal.

12. The apparatus recited in claim 11 wherein:
said comparator means includes a voltage comparator having inverting and noninverting inputs, an output and a null input for controlling the voltage difference between said inverting and noninverting inputs at which the voltage developed at said output changes level, said ramp-like signal being coupled to one of said inverting and noninverting inputs, said DC signal being coupled to said other one of said inverting and noninverting inputs, said first output signal being generated at said output, said first output signal having said first level when the magnitude of said ramp-like signal exceeds the magnitude of said DC signal by said voltage difference, said first output signal having said second level when the magnitude of said DC signal exceeds the magnitude of said ramp-like signal by said voltage difference, said correction signal being coupled to said null means to control said voltage difference.

13. The apparatus recited in claim 12 wherein:
said synchronizing means includes a data type flip-flop having a clock input, a data input and first and second outputs for developing complementary output signals, said oscillator signal being coupled to said clock input, said first output signal being coupled to said data input, one of said complementary output signals being coupled to said programmable factor control means, the other of said complementary output signals being coupled to said low pass filter means.

* * * * *